(12) United States Patent
Takahashi

(10) Patent No.: US 9,626,005 B2
(45) Date of Patent: Apr. 18, 2017

(54) REMOVABLE PUSHBUTTON TYPE INTERFACE DEVICE FOR TOUCH PANEL

(71) Applicant: Sony Computer Entertainment Inc., Tokyo (JP)

(72) Inventor: Yusuke Takahashi, Kanagawa (JP)

(73) Assignees: Sony Corporation, Tokyo (JP); Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 14/789,046

(22) Filed: Jul. 1, 2015

(65) Prior Publication Data

US 2016/0026259 A1 Jan. 28, 2016

(30) Foreign Application Priority Data

Jul. 23, 2014 (JP) ................................. 2014-150229

(51) Int. Cl.
*G06F 3/044* (2006.01)
*G06F 3/02* (2006.01)
(Continued)

(52) U.S. Cl.
CPC .......... *G06F 3/0202* (2013.01); *G06F 3/0338* (2013.01); *G06F 3/03547* (2013.01);
(Continued)

(58) Field of Classification Search
CPC .. G06F 3/0202; G06F 3/0338; G06F 3/03547; G06F 3/044; G06F 2203/04101;
(Continued)

(56) References Cited

U.S. PATENT DOCUMENTS

2011/0157056 A1* 6/2011 Karpfinger ............ G06F 3/0202
345/173
2012/0120019 A1 5/2012 Choi
(Continued)

FOREIGN PATENT DOCUMENTS

JP 11296300 A 10/1999
JP 2003303042 A 10/2003
(Continued)

OTHER PUBLICATIONS

Office Action for corresponding JP Patent Application No. 2014-150229, 5 pages, dated May 17, 2016.
(Continued)

*Primary Examiner* — Larry Sternbane
(74) *Attorney, Agent, or Firm* — Matthew B. Dernier, Esq.

(57) ABSTRACT

An inputting device for inputting information to a touch sensor is disclosed which is less likely to cause false detection and allows comparatively free selection of a disposition position of the inputting device relative to a touch sensor. The inputting device includes a conductive member disposed on a touch sensor of the capacitance type and cooperating with the touch sensor to form a capacitor therebetween, a ground terminal connected to the ground of the touch sensor, a current path interconnecting the conductive member and the ground terminal, and a switch disposed on the current path. A result of detection by the touch sensor varies in response to switching of the switch.

8 Claims, 11 Drawing Sheets

(51) Int. Cl.
    *G06F 3/0354*    (2013.01)
    *G06F 3/0338*    (2013.01)
    *H03K 17/96*     (2006.01)

(52) U.S. Cl.
    CPC ........... *G06F 3/044* (2013.01); *H03K 17/962*
        (2013.01); *G06F 2203/04101* (2013.01); *G06F*
            *2203/04104* (2013.01); *H03K 2217/960735*
                                                    (2013.01)

(58) Field of Classification Search
    CPC ........ G06F 2203/04104; H03K 17/962; H03K
                        2217/96054; H03K 2217/960735
    See application file for complete search history.

(56)            References Cited

U.S. PATENT DOCUMENTS

2012/0188694 A1      7/2012  Sakaibara
2015/0323987 A1*    11/2015  Ross .................... G06F 3/01
                                                        345/156

FOREIGN PATENT DOCUMENTS

JP         2010044730 A      2/2010
JP            3176588 U      6/2012
JP       2015-075796 A1 *    4/2015    ............. G06F 3/044
JP         2015075796 A      4/2015
JP            3190901 U      1/2017

OTHER PUBLICATIONS

Office Action for corresponding JP Patent Application No. 2014-150229, 9 pages, dated Jan. 10, 2017.

\* cited by examiner

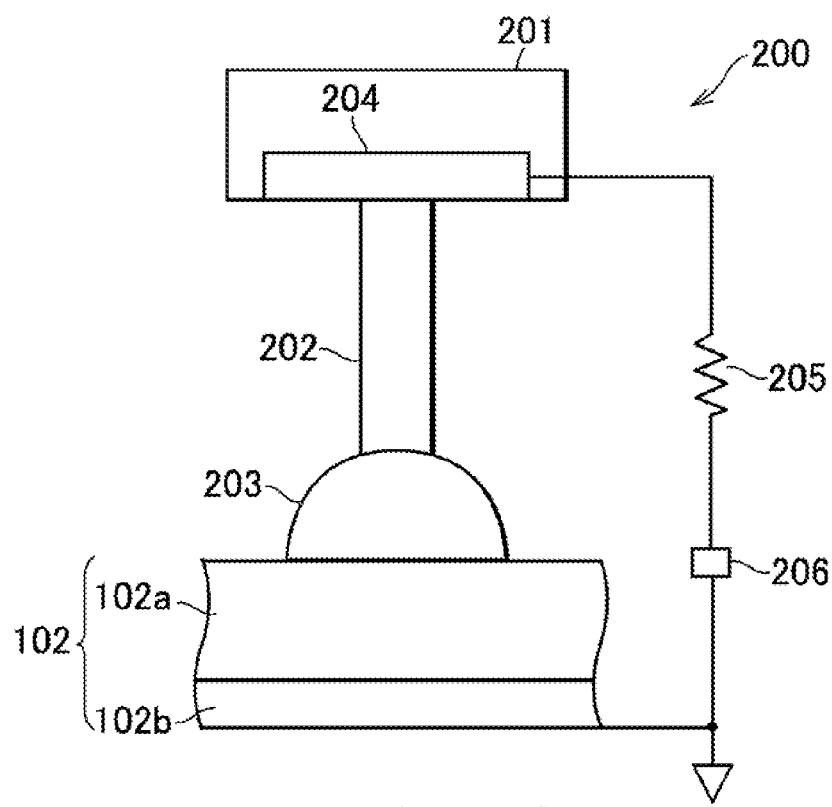
F I G. 1 0 A
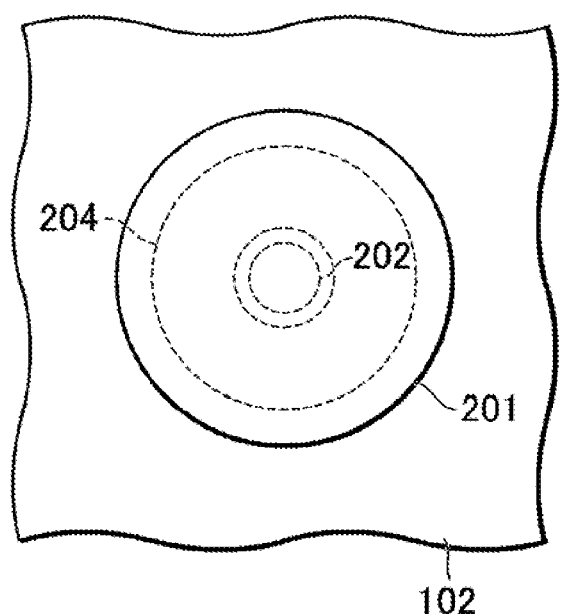
F I G. 1 0 B

REMOVABLE PUSHBUTTON TYPE INTERFACE DEVICE FOR TOUCH PANEL

BACKGROUND

The present disclosure relates to an inputting device for inputting information to a touch sensor.

A capacitance type touch sensor which detects contact or approach of a material body such as a finger of a user or a stylus is known. Such a touch sensor as just described is incorporated in an information processing apparatus such as, for example, a smartphone or a portable game machine and is used to accept an input of information from the outside (refer to, for example, U.S. Patent Application Publication No. 2012/0188694.

A pushbutton is disposed on the touch sensor. The pushbutton moves in an interlocking relationship with a conductive member such that, if a user depresses the pushbutton, then the conductive member approaches the touch sensor. This movement of the conductive member is detected by the touch sensor, and the information processing apparatus detects though the detection of the conductive member that the pushbutton is depressed. In this manner, by disposing the conductive member, whose distance to the touch sensor varies, on the touch sensor, information can be inputted to the touch sensor by various methods in addition to a method which uses a finger of a user.

SUMMARY

The conductive member used in the pushbutton described above is normally electrically isolated from the touch sensor, and the potential of the conductive member is not stable. Further, since the pushbutton and the conductive member are structured for interlocking movement, when the pushbutton is operated, the amount of movement of the conductive member is restricted. From the reasons, an operation of the pushbutton described above is not easily detected, and false detection is likely to occur. Further, the pushbutton described above must be disposed just above the touch sensor and cannot be disposed at a position spaced from the touch sensor. In this manner, an inputting device which implements inputting of information to the touch sensor by physically changing the distance between the conductive member and the touch sensor has a problem in that it is likely to cause false detection and is restricted in terms of the disposition position thereof.

It is desirable of the present disclosure to provide an inputting device for inputting information to a touch sensor which is less likely to cause false detection and allows comparatively free selection of a disposition position of the inputting device relative to the touch sensor.

According to embodiments of the present disclosure, there is provided an inputting device including a conductive member disposed on a capacitance type touch sensor and cooperating with the touch sensor to form a capacitor therebetween, a ground terminal connected to a ground of the touch sensor, a current path interconnecting the conductive member and the ground terminal, and a switch disposed on the current path, a result of detection by the touch sensor varying in response to switching of the switch.

The above and other objects, features and advantages of the present disclosure will become apparent from the following description and the appended claims, taken in conjunction with the accompanying drawings in which like parts or elements denoted by like reference characters.

BRIEF DESCRIPTION OF THE DRAWINGS

FIG. 6B is a diagram illustrating detection result of the touch sensor in a state in which the switch is on;

FIG. 10A is a sectional view depicting an example of a tiltable operation member;

FIG. 10B is a top plan view depicting the example of the tiltable operation member.

DETAILED DESCRIPTION OF THE PREFERRED EMBODIMENTS

In the following, preferred embodiments of the present disclosure are described in detail with reference to the accompanying drawings.

[First Embodiment]

First, an inputting device 1a according to a first embodiment of the present disclosure is described with reference to FIGS. 1A to 6B. The inputting device 1a according to the present embodiment is an attachment for operation inputting attached to an information processing apparatus 100 which includes a touch sensor. The information processing apparatus 100 may be any of various apparatus which include a touch sensor such as a portable game machine, a smartphone, or a controller for a game machine for home use. In the following description, it is assumed that the information processing apparatus 100 is a portable game machine which includes the touch sensor disposed on the surface of a housing thereof.

Figure 1A:
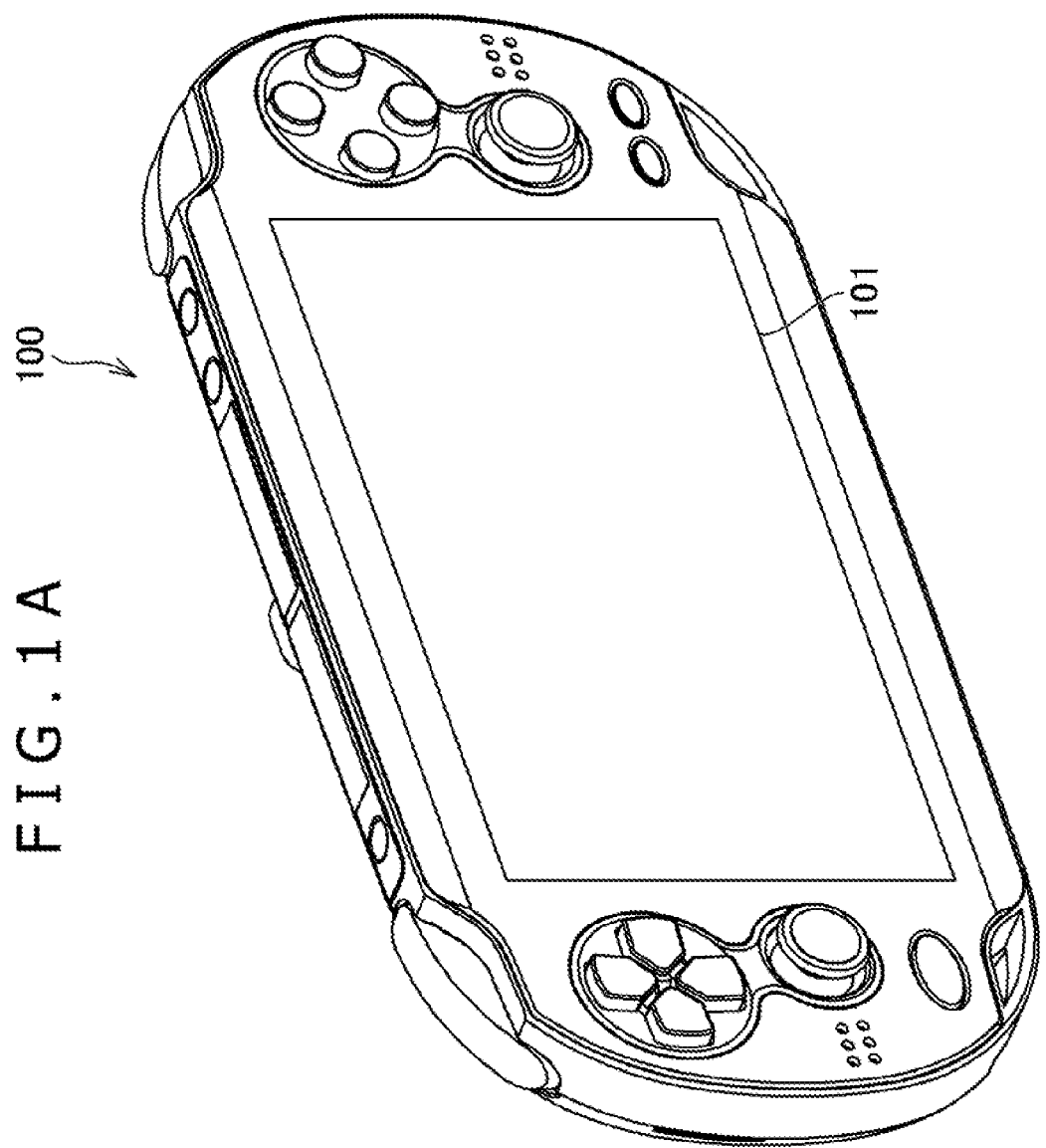
FIG. 1A is a perspective view of an information processing apparatus as viewed from the front side.
Figure 1B:
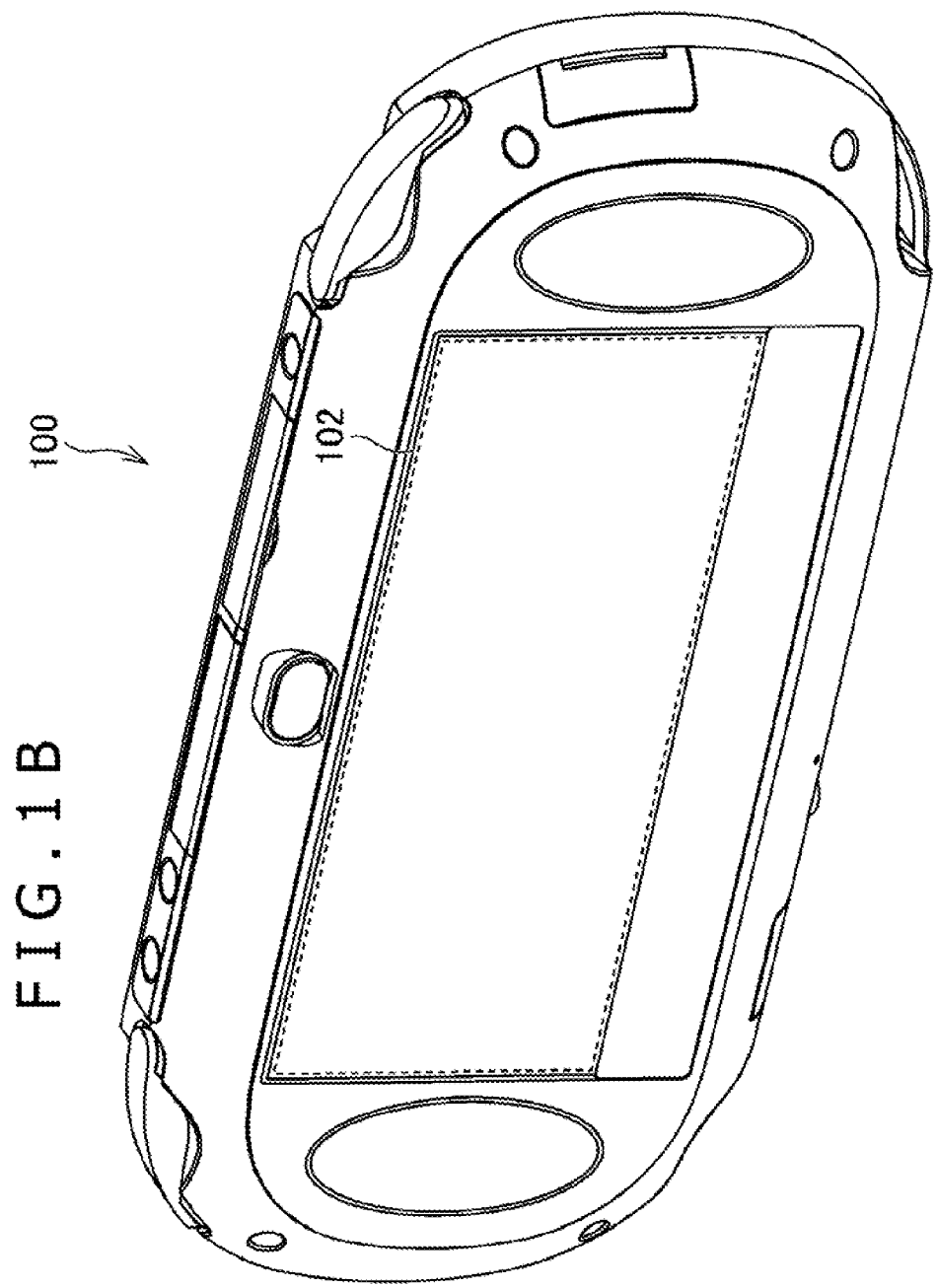
FIG. 1B is a perspective view of the information processing apparatus as viewed from the rear side.
Figure 1C:
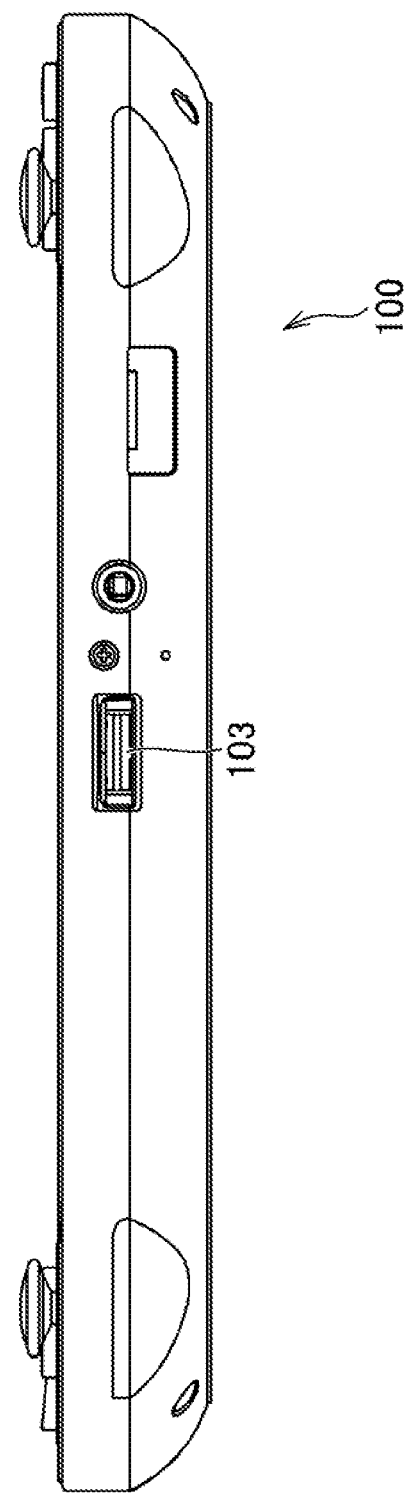
FIG. 1C is a bottom plan view of the information processing apparatus.

FIGS. 1A, 1B, and 1C depict an example of an appearance of the information processing apparatus 100. In particular, FIG. 1A is a perspective view depicting the information processing apparatus 100 as viewed from the front side; FIG. 1B is a perspective view of the information processing apparatus 100 as viewed from the rear; and FIG. 1C is a bottom plan view of the information processing apparatus 100. As depicted in FIGS. 1A, 1B, and 1C, a touch panel 101 is disposed on the front side and a touch sensor 102 is disposed on the rear side of the information processing apparatus 100. Further, a connector 103 of the female type which complies with a universal serial bus (USB) standard is provided on the bottom face of the information processing apparatus 100.

The touch sensor 102 is of the capacitance type and detects, when a material body is brought into contact with a detection face of the touch sensor 102 or moves to a predetermined detection range on the detection face of the touch sensor 102, the position of the material body on the detection face. It is to be noted that the touch sensor 102 in the present embodiment is assumed to be a touch sensor of the multi-point detection type (multi-touch type) which can detect a plurality of material bodies at different places on the detection face at the same timing.

The inputting device 1a accepts an operation input from a user and inputs the substance of the operation to the touch sensor 102 disposed on the rear face of the information processing apparatus 100. The inputting device 1a is attached to the information processing apparatus 100 in such a manner as to cover the detection face of the touch sensor 102.

Figure 2A:
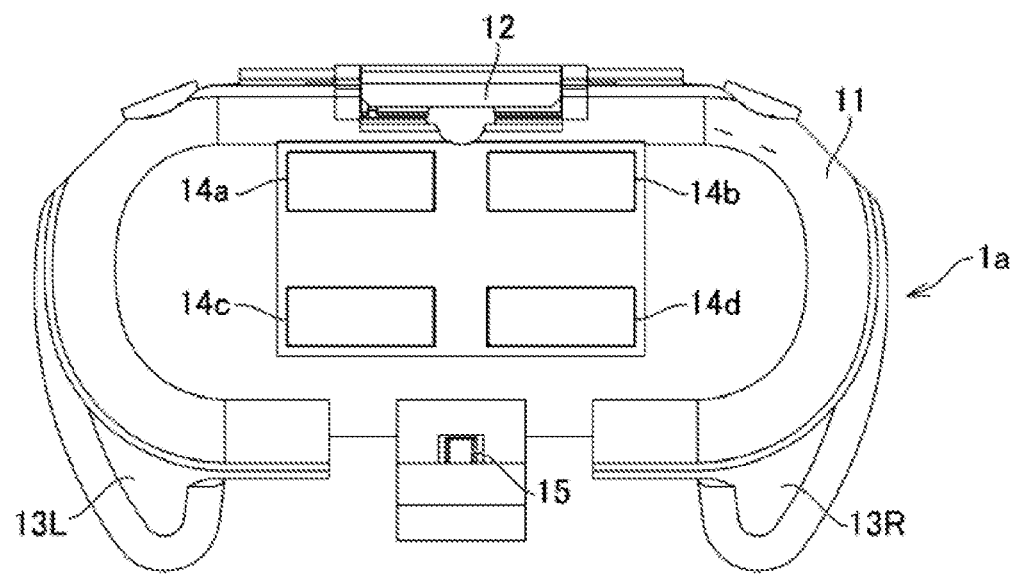
FIG. 2A is a front elevational view of an inputting device according to a first embodiment of the present disclosure.
Figure 2B:
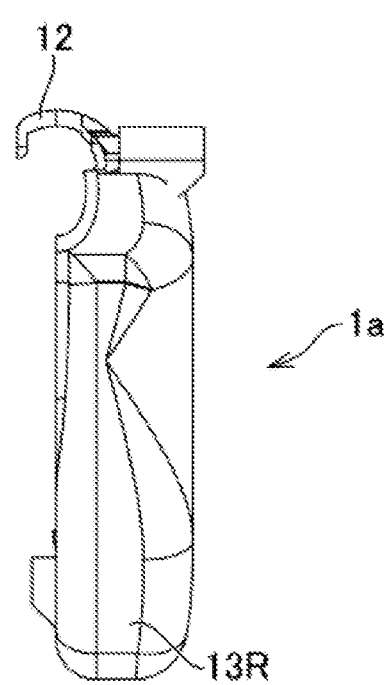
FIG. 2B is a right side elevational view of the inputting device according to the first embodiment of the present disclosure.
Figure 2C:
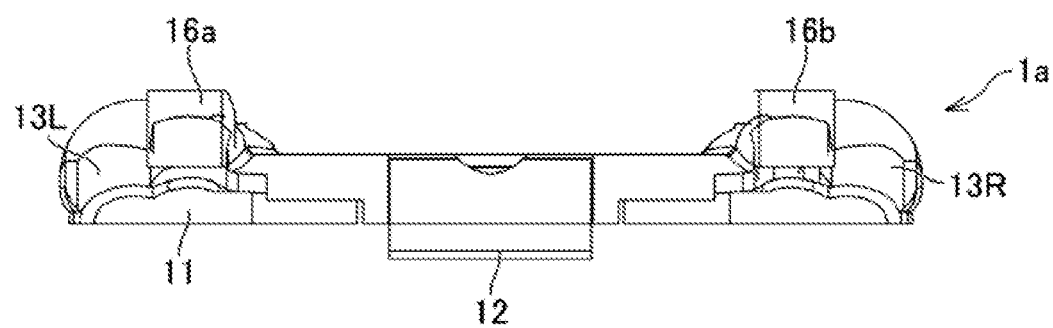
FIG. 2C is a top plan view of the inputting device according to the first embodiment of the present disclosure.
Figure 2D:
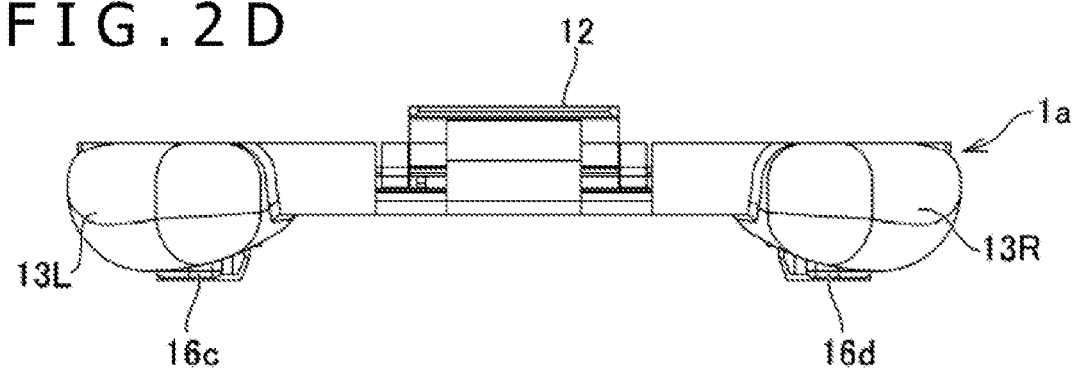
FIG. 2D is a bottom plan view of the inputting device according to the first embodiment of the present disclosure.
Figure 2E:
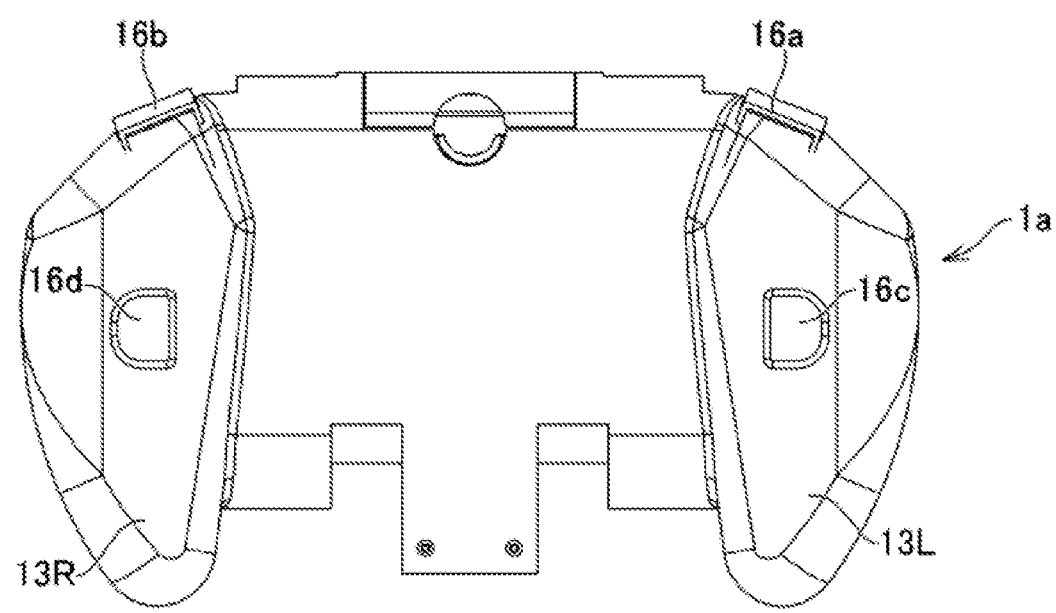
FIG. 2E is a rear elevational view of the inputting device according to the first embodiment of the present disclosure.
Figure 3:
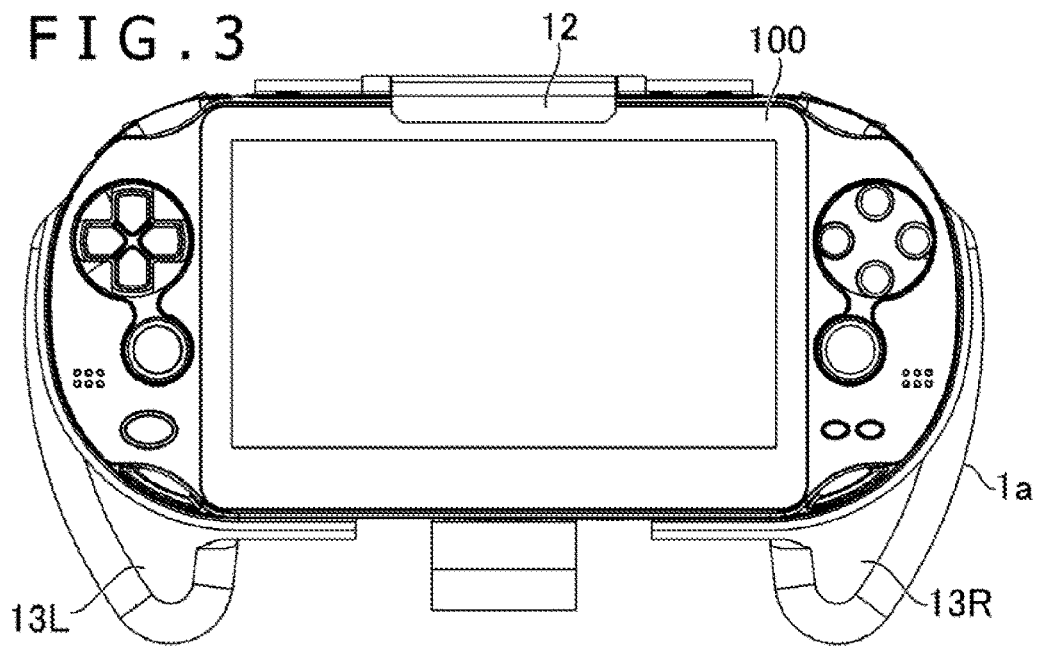
FIG. 3 is a front elevational view of the inputting device depicted in FIGS. 2A to 2E in a state in which the inputting device is attached to the information processing apparatus.

FIGS. 2A to 2E are views depicting an example of an appearance of the inputting device 1a. In particular, FIG. 2A is a front elevational view of the inputting device 1a; FIG. 2B is a right side elevational view; FIG. 2C is a top plan view; FIG. 2D is a bottom plan view; and FIG. 2E is a rear elevational view. As depicted in FIGS. 2A to 2E, a recess portion 11 is formed over an overall area of the front (front face) of the inputting device 1a, and the information processing apparatus 100 is accommodated in the recess portion 11. FIG. 3 is a front elevational view illustrating a manner in which the inputting device 1a is attached to the information processing apparatus 100. A hook portion 12 for fixing the information processing apparatus 100 is provided at an upper portion of the front of the inputting device 1a. When the inputting device 1a is to be attached to the information processing apparatus 100, the hook portion 12 is engaged with the information processing apparatus 100. A pair of grip portions 13R and 13L for being gripped by the hands of a user are provided at left and right portions of the inputting device 1a.

Four conductive members 14a to 14d are disposed on the bottom face of the recess portion 11. The conductive members 14a to 14d are made of a thin metal plate of a rectangular shape and disposed in an opposing relationship to the detection face of the touch sensor 102 when the inputting device 1a is attached to the information processing apparatus 100. It is to be noted that the conductive members 14a to 14d are fixed at respective positions to the surface of the inputting device 1a. In the state in which the inputting device 1a is attached to the information processing apparatus 100, the positional relationship between the inputting device 1a and the information processing apparatus 100 does not vary. Therefore, while the inputting device 1a is used, the relative positions of the conductive members 14a to 14d to the touch sensor 102 do not change, and also the distance between the conductive members 14a to 14d and the touch panel 102 does not change either.

On a lower side face of the recess portion 11 on the front face of the inputting device 1a, a male connector 15 of a shape corresponding to the connector 103 of the information processing apparatus 100 is provided in a projecting manner. The connector 15 is inserted into the connector 103 when the inputting device 1a is attached to the information processing apparatus 100. A ground terminal 15a is disposed in the connector 15 and is electrically connected to a ground terminal of the connector 103 when the inputting device 1a is attached to the information processing apparatus 100.

Four pushbuttons 16a to 16d are disposed on the surface of a housing of the inputting device 1a. Four switches 17a to 17d are provided in the inside of the inputting device 1a in a corresponding relationship to the pushbuttons 16a to 16d, respectively. In a state in which the pushbuttons 16a to 16d are not depressed, the corresponding switches 17a to 17d exhibit an off state, and if one of the pushbuttons 16a to 16d is depressed, then a corresponding one of the switches 17a to 17d is placed into an on state.

Figure 4:
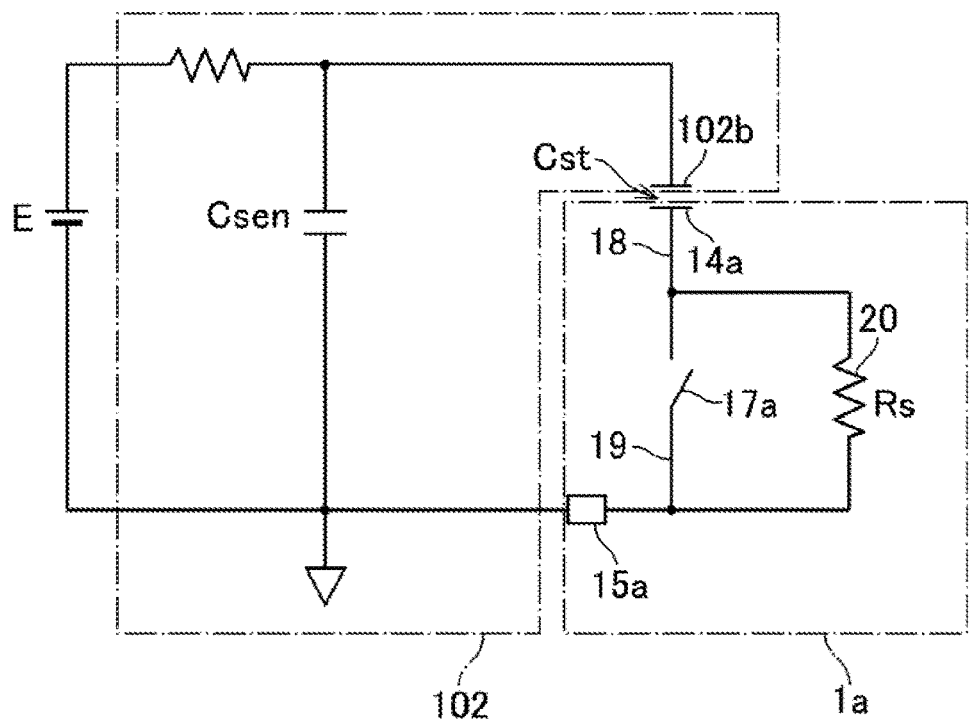
FIG. 4 is an equivalent circuit diagram of the inputting device depicted in FIGS. 2A to 2E in the state in which the inputting device is attached to the information processing apparatus.
Figure 5:
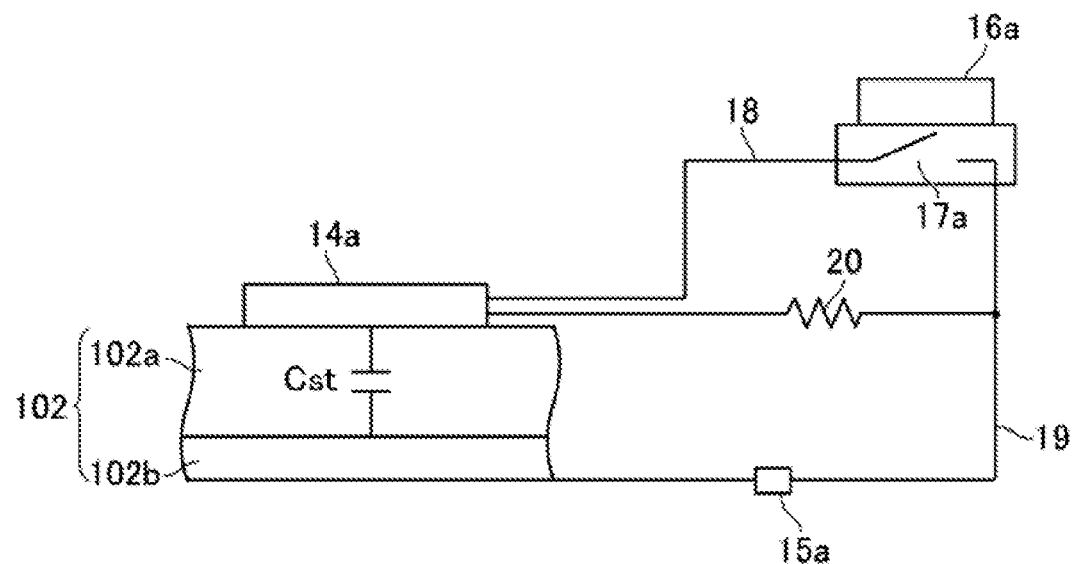
FIG. 5 is a view schematically illustrating a connection relationship of components of the inputting device depicted in FIGS. 2A to 2E in the state in which the inputting device is attached to the information processing apparatus.

FIGS. 4 and 5 are views illustrating an operation principle of the inputting device 1a according to the present embodiment. In particular, FIG. 4 is an equivalent circuit diagram of the inputting device 1a in a state in which the inputting device 1a is attached to the information processing apparatus 100. Meanwhile, FIG. 5 is a view schematically illustrating a connection relationship of the components of the inputting device 1a and the information processing apparatus 100 in the connected state. It is to be noted here that, although description is given of an operation principle of the inputting device 1a using a combination of the conductive member 14a and the switch 17a as a representative, also the other combinations of the conductive members 14b to 14d and the switches 17b to 17d function similarly based on similar connection relationships.

As depicted in FIGS. 4 and 5, in the inputting device 1a, the conductive member 14a and the ground terminal 15a are connected by a current path configured from conductors 18 and 19, and the switch 17a is disposed midway of the current path. More particularly, the conductive member 14a and one terminal of the switch 17a are electrically connected to each other by the conductor 18, and the other terminal of the switch 17a and the ground terminal 15a are electrically connected to each other by the conductor 19. Further, in the present embodiment, a resistor 20 is connected in parallel to the switch 17a. In the following description, the resistance value of the resistor 20 is represented by Rs.

As described hereinabove, when the inputting device 1a is attached to the information processing apparatus 100, the ground terminal 15a is connected to the ground terminal of the connector 103. Therefore, the ground terminal 15a is electrically connected to and has an equal potential to that of the ground of the entire information processing apparatus 100. Consequently, the ground terminal 15a is electrically connected also to the ground of the touch sensor 102.

In a state in which the inputting device 1a is attached to the information processing apparatus 100, the conductive member 14a is opposed to a conductive film 102b in the touch sensor 102 with a protective film 102a interposed therebetween. Consequently, a capacitor Cst is formed between the conductive member 14a and the conductive film 102b. The capacitor Cst is connected in parallel to a capacitor Csen for detection formed in the touch sensor 102 as depicted in FIG. 4.

As described hereinabove, in a state in which the pushbutton 16a is not depressed, the switch 17a exhibits an off state. In this state, current flows to the capacitor Cst only through the resistor 20. Here, if the resistance value Rs is sufficiently high, then high current does not flow to the capacitor Cst, and therefore, a comparatively long period of time is required until charge is accumulated in the capacitor Cst. As described in detail below, if the detection cycle of the touch sensor 102 is sufficiently short with respect to the required period of time, then the touch sensor 102 is influenced little by the conductive member 14a. Consequently, the detection result then exhibits little difference from that when the conductive member 14a does not exist. Therefore, when the switch 17a is off, such a detection result as is obtained when the conductive member 14a does not exist is obtained.

Figure 6A:
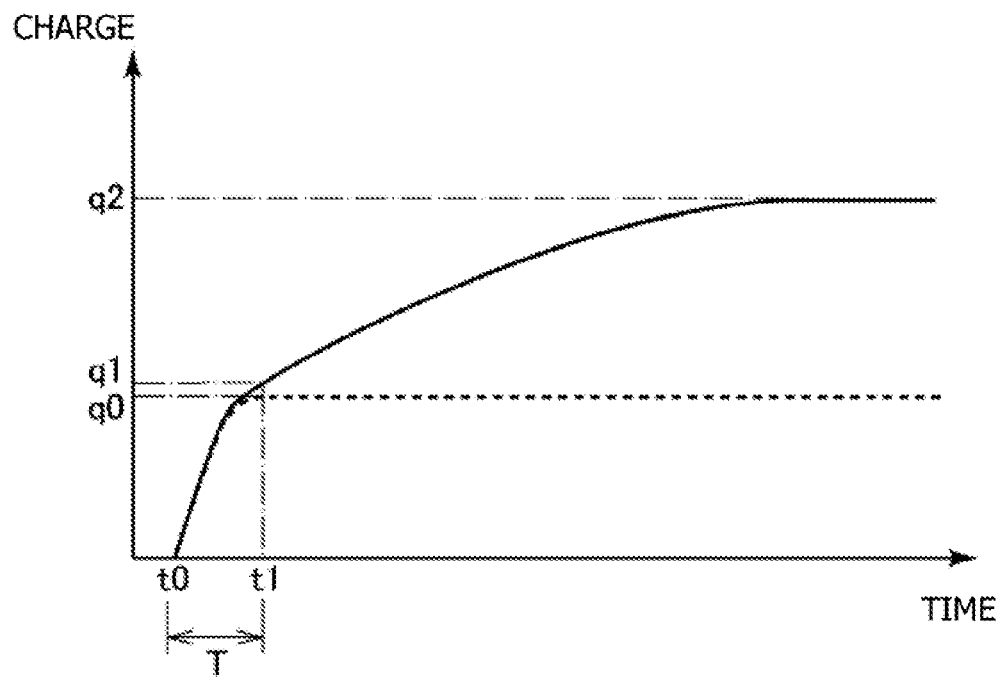
FIG. 6A is a diagram illustrating detection result of a touch sensor in a state in which a switch is off.

FIG. 6A is a view illustrating a detection result of the touch sensor 102 in a state in which the switch 17a is in an off state and depicts a time variation of charge accumulated in the touch sensor 102. Here, time t0 indicates a timing at which a first cycle of detection by the touch sensor 102 is started, and application of a voltage E to the touch sensor 102 is started at this time t0. Meanwhile, time t1 indicates a timing at which detection by the touch sensor 102 is carried out. In the following time, the elapsed time from time t0 to time t1 is represented as detection time T. A graph of a solid line in FIG. 6A indicates a time variation of charge when the inputting device 1a is attached to the information processing apparatus 100 and the switch 17a is in an off state. Meanwhile, a graph of a broken line in FIG. 6A indicates a time variation of charge when the inputting device 1a is not mounted on the information processing apparatus 100 and a material body does not exist on the detection face of the touch sensor 102.

As indicated by the broken line in FIG. 6A, if no material body exists on the detection face of the touch sensor 102, then reference charge q0 determined by the following expression is stored into the touch sensor 102 till time t1 by the capacitor Csen:

$$q0 = Csen \cdot E$$

The touch sensor 102 acquires a difference value Δ of the charge accumulated till time t1 from the reference charge q0 as a detection value. Then, if the difference value Δ is equal to or higher than a predetermined determination threshold value, then the touch sensor 102 determines that a material body exists at the detection position, but if the difference value Δ is lower than the determination threshold value, then the touch sensor 102 determines that no material body exists.

Where the conductive member 14a is disposed on the detection face of the touch sensor 102 to form the capacitor Cst, if it is possible to wait for a sufficiently long period of time, then it is considered that charge q2 determined by the following expression is finally accumulated in the touch sensor 102 by a composite capacitance (Cst+Csen) of the capacitor Cst and the capacitor Csen:

$$q2 = (Cst + Csen) \cdot E$$

However, in the present embodiment, since the resistance value Rs is high, a long period of time is required in comparison with the detection time T until the charge q2 is accumulated. Therefore, charge q1 accumulated till time t1 at which detection by the touch sensor 102 is carried out exhibits a value little different from that of the reference charge q0 as depicted in FIG. 6A. In this case, since the difference value Δ becomes lower than the determination threshold value, the touch sensor 102 does not detect the presence of the conductive member 14a.

On the other hand, if the pushbutton 16a is depressed to place the switch 17a into an on state, then high current flows to the conductors 18 and 19 through the switch 17a, and charge is accumulated into the capacitor Cst in a shorter period of time than that in the case in which the switch 17a is off. Therefore, the touch sensor 102 detects the presence of a material body at the position of the conductive member 14a.

Figure 6B:
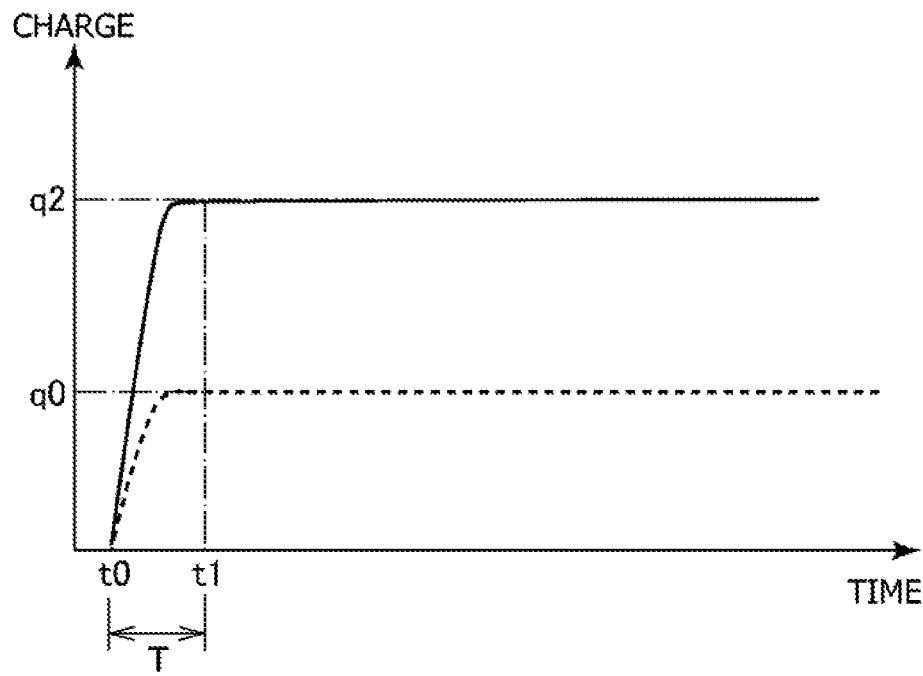

FIG. 6B is a view illustrating a detection result by the touch sensor 102 in this case and depicts a time variation of charge accumulated in the touch sensor 102 similarly to FIG. 6A. Time t0 and time t1 in FIG. 6B indicate a starting timing of voltage application and a detection timing by the touch sensor 102, respectively, similarly as in FIG. 6A. Further, a graph of a broken line in FIG. 6B indicates a time variation of charge in a case in which a material body of a detection target does not exist, and a graph of a solid line indicates a time variation of charge when the inputting device 1a is attached to the information processing apparatus 100 and the switch 17a is on. As depicted in FIG. 6B, when the switch 17a is on, charge q2 is accumulated into the touch sensor 102 in a shorter period of time than the detection time T. In this case, the difference value Δ is Δ=Cst·E and the magnitude of the difference value Δ exceeds the determination threshold value. Therefore, the touch sensor 102 detects that a material body exists at the position of the conductive member 14a. Since the detection result of the touch sensor 102 varies in this manner when the switch 17a is placed into an on state from an off state, the information processing apparatus 100 can detect the switching of the switch 17a by the touch sensor 102.

Here, in order to improve the accuracy when switching of the switch 17a is detected, it is desired to make the difference between the charge q2 and the reference charge q0 greater, and to this end, it may be necessary to set the capacitance of the capacitor Cst to a higher value in comparison with the capacitor Csen. Therefore, it is desirable to set the area of the conductive member 14a as great as possible and avoid formation of a gap between the conductive member 14a and the touch sensor 102 to shorten the distance from the conductive member 14a to the conductive film 102b. Especially in the present embodiment, the inputting device 1a is configured such that, when it is attached to the information processing apparatus 100, the conductive member 14a normally keeps the state in which it contacts with the surface of the touch sensor 102.

It is to be noted that, in the present embodiment, the conductive member 14a is connected to the ground terminal 15a via the resistor 20. Consequently, when the switch 17a is off, the conductive member 14a is prevented from being placed into a state in which it is electrically isolated from the touch sensor 102 (into a floating state), and consequently, the potential of the conductive member 14a can be stabilized. However, if the resistor 20 does not exist, then no current flows to the capacitor Cst at all in a state in which the switch 17a is off, but if the switch 17a is switched on, then high current flows to the capacitor Cst. Therefore, in such a detection condition that, in a state in which the switch 17a is off, the potential of the conductive member 14a can be permitted to become unstable, the existence of the resistor 20 is not required in principle.

Since the detection result of the touch sensor 102 varies in response to switching of the switch 17a as described above, such variation can be utilized to allow the touch sensor 102 to detect an operation input to the pushbutton 16a by the user. More particularly, if the user depresses the pushbutton 16a, then the corresponding switch 17a is switched from an off state to an on state, and the touch sensor 102 detects that a material body exists at the position of the conductive member 14a connected to the switch 17a. Similarly, the information processing apparatus 100 can acquire a result of detection by the touch sensor 102 at the position of the pushbuttons 16b, 16c, and 16d to detect that the pushbuttons 16b, 16c, and 16d are individually depressed by the user.

In the inputting device 1a according to the present embodiment, since a physical movement of a pushbutton 16 is converted into an electric signal and detected by the touch sensor 102, the pushbuttons 16 which become a target of an operation input by a user need not be disposed on the touch sensor 102. In particular, any pushbutton 16 can be disposed at an arbitrary position spaced from the touch sensor 102 only if a switch 17 which is interlocked with the pushbutton 16 is electrically connected to a conductive member 14 and the ground terminal 15a. Further, the conductive member 14 disposed on the touch sensor 102 need not be moved relative to the touch sensor 102 but may be disposed at a fixed position opposing to the touch sensor 102. Therefore, when the shape of the inputting device 1a according to the present embodiment is designed, physical restrictions are small, and it is possible to reduce the device itself in size and thickness and dispose the pushbuttons 16 at various positions or in various directions at or in which the user can operate them easily.

Further, in the inputting device 1a according to the present embodiment, switching of a switch 17 is detected making use of current flowing to the capacitor Cst by the voltage E applied to the touch sensor 102. Therefore, there is no necessity to build a unique power supply in the inputting device 1a side.

Further, in the inputting device 1a according to the present embodiment, the conductive member 14 is disposed merely on the touch sensor 102 and operates only if the ground terminal 15a is connected to the ground of the information processing apparatus 100. Therefore, there is no necessity to provide a special hardware configuration on the information processing apparatus 100 side, and the inputting device 1a can be attached as an attachment to various known information processing apparatus which include a touch sensor on the surface of a housing thereof.

Further, in the inputting device 1a according to the present embodiment, since the ground of the information processing apparatus 100 and the ground terminal 15a of the inputting device 1a are electrically connected to each other, the conductive member 14 is not placed into a state in which it is electrically isolated from the information processing apparatus 100. Therefore, different from a case in which the position of a material body which is electrically isolated from a touch sensor such as a finger or a stylus is detected by the touch sensor, false detection of the touch sensor by noise is less likely to occur.

It is to be noted that, while, in the foregoing description, the ground terminal 15a is connected to the ground terminal in the connector 103 of the USB standard, the method for connecting the ground terminal 15a to the information processing apparatus 100 is not limited to such a method as just described, but various methods can be adopted. The information processing apparatus 100 includes not only the connector 103 of the USB standard but also various connectors such as connectors for connecting an earphone, a microphone, or a charger, and a ground terminal is built in such connectors. Therefore, the inputting device 1a may be configured such that a connector 15 whose position and shape corresponding to those of one of the connectors is provided and the ground terminal 15a built in the connector 15 is connected to the ground of the information processing apparatus 100.

Further, the ground terminal 15a may be configured such that it is brought into contact, when the inputting device 1a is attached to the information processing apparatus 100, with a terminal for charging exposed to the surface of the housing of the information processing apparatus 100, a screw connecting to the ground of a circuit board or the like. In this case, the inputting device 1a does not require the connector 15 for connecting the ground terminal 15a to the information processing apparatus 100. Further, if part of the surface of the housing of the information processing apparatus 100 may be configured from a conductor such as metal and the conductor serves as the ground of the information processing apparatus 100, then the ground terminal 15a may be contacted with the conductor.

Further, while each conductive member 14 in the foregoing description is formed from a rectangular metal plate, the conductive member 14 may not be formed in a rectangular shape but may be formed in various shapes. Further, the conductive member 14 may not be a metal plate but may be metal foil or the like formed as a film on the surface of the inputting device 1a or may be a member made of resin such as conductive rubber. Alternatively, the conductive member 14 may be configured from a combination of a plurality of parts such that conductive rubber is applied to the surface of a metal plate.

[Second Embodiment]

Now, an inputting device 1b according to a second embodiment of the present disclosure is described. The inputting device 1b according to the present embodiment includes a conductive member 14, a ground terminal 15a, a pushbutton 16, a switch 17, conductors 18 and 19, and a resistor 20 similarly to the first embodiment. It is to be noted that detailed description of those of the components mentioned which have like functions to those in the first embodiment is omitted, but description is given below principally of differences from the first embodiment.

Figure 7:
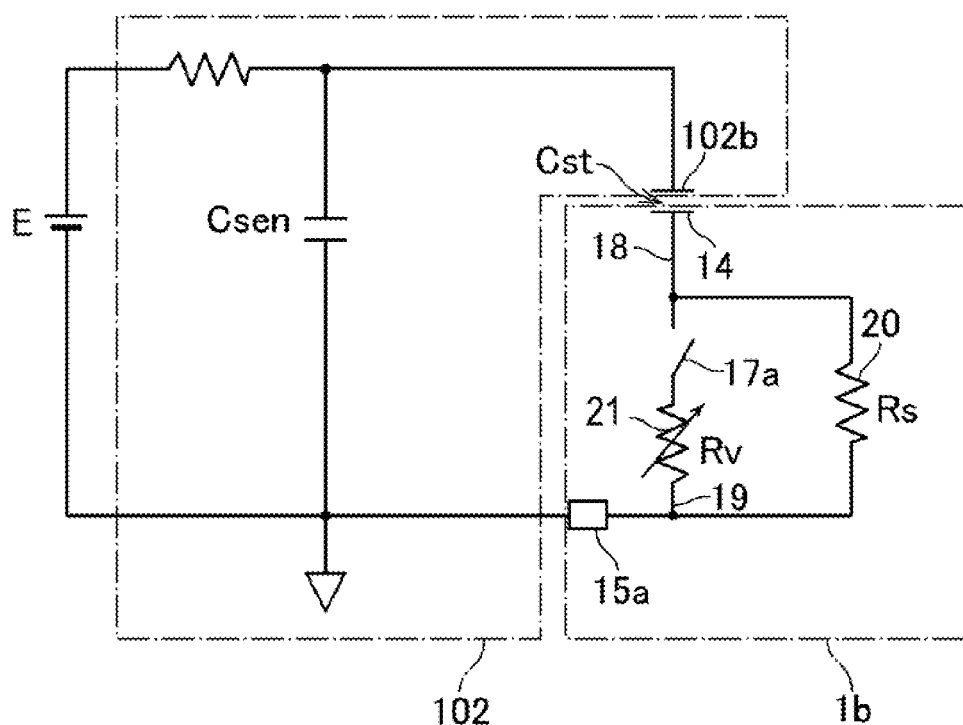
FIG. 7 is an equivalent circuit diagram of an inputting device according to a second embodiment of the present disclosure in a state in which an inputting device is attached to the information processing apparatus.

Different from the first embodiment, the inputting device 1b further includes a variable resistor 21. FIG. 7 is an equivalent circuit diagram in a state in which the inputting device 1b is attached to the information processing apparatus 100. As depicted in FIG. 7, the variable resistor 21 is connected in series to the switch 17 on a current path interconnecting the conductive member 14 and the ground terminal 15a. Further, the resistor 20 is connected in parallel to the switch 17 and the variable resistor 21. In the following description, the resistance value of the variable resistor 21 is represented by Rv.

The magnitude of the resistance value Rv of the variable resistor 21 varies in response to the operation amount of the pushbutton 16 by the user. In particular, when the user begins to depress the pushbutton 16, the switch 17 is switched from an off state into an on state. Then, if the user further depresses the pushbutton 16, then the resistance value Rv of the variable resistor 21 varies in response to the depression amount. The variable resistor 21 having the resistance value Rv whose magnitude varies in response to the operation amount of the pushbutton 16 by the user in this manner can be implemented by various known techniques.

Figure 8:
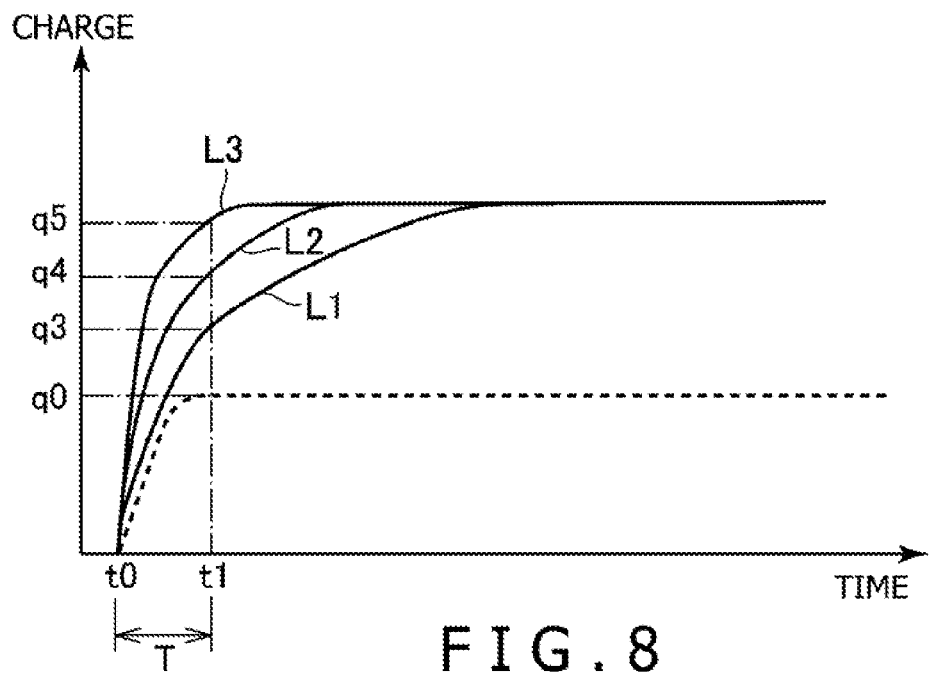
FIG. 8 is a diagram illustrating detection results of a touch sensor in the second embodiment of the present disclosure.

In the present embodiment, the detection result of the touch sensor 102 varies in response the variation of the resistance value Rv of the variable resistor 21. Therefore, by referring to the detection result of the touch sensor 102, the information processing apparatus 100 can specify by what operation amount the pushbutton 16 is operated by the user. FIG. 8 is a view illustrating a variation of the detection result of the touch sensor 102 in response to the variation of the resistance value Rv of the variable resistor 21 and depicts a time variation of charge accumulated in the touch sensor 102 similarly to FIGS. 6A and 6B. Further, time t0 and time t1 indicate a starting timing of voltage application and a detection timing of the touch sensor 102, respectively, and a graph of a broken line indicates a time variation of charge when a material body of a detection target does not exist.

In FIG. 8, time variations of charge in cases in which the resistance value Rv has a high value, an intermediate value, and a low value are indicated by graphs of solid lines L1, L2, and L3, respectively. Further, charge amounts accumulated till time t1 in the cases are represented by q3, q4, and q5, respectively. As depicted in FIG. 8, as the resistance value Rv increases, increased time is required before charge is accumulated fully into the touch sensor 102, and therefore, the amount of charge detected at time t1 decreases and the difference value Δ decreases. Therefore, the information processing apparatus 100 can specify the operation amount of the pushbutton 16 by the user by acquiring the difference value Δ and evaluating the magnitude of the difference value Δ.

It is to be noted that, although, in the foregoing description, the operation amount of the pushbutton 16, namely, the amount by which the pushbutton 16 is depressed, is detected, the inputting device 1b is not limited to this but may be configured such that information representative of strength of pressing when the user depresses the pushbutton 16 is inputted to the touch sensor 102. In this case, the variable resistor 21 may be configured such that the resistance value Rv thereof varies in response to the strength of the pressing upon the pushbutton 16.

[Third Embodiment]

Now, an inputting device 1c according to a third embodiment of the present disclosure is described. In the foregoing description, the inputting device in any of the embodiments described above inputs information representative of the substance of an operation input of a pushbutton 16 by a user to the touch sensor 102. However, the inputting device according to the embodiments of the present disclosure may otherwise input not the substance of an operation input by a user but other information to a touch sensor. The inputting device 1c according to the present third embodiment represents an example of such an inputting device as described above and inputs N-bit digital data to the information processing apparatus 100.

Figure 9:
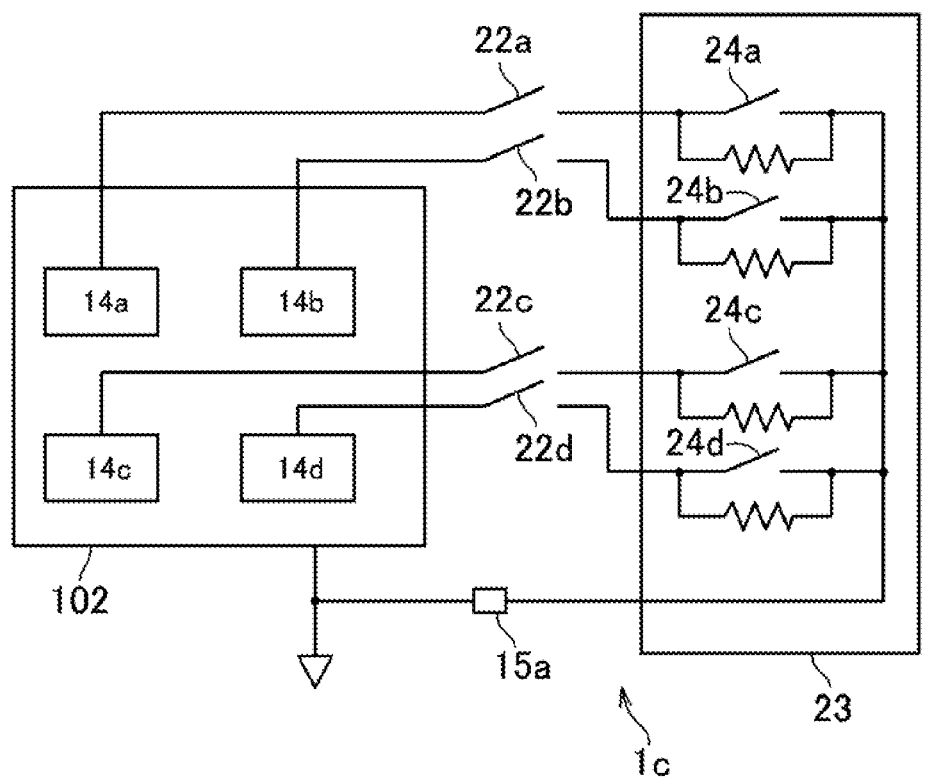
FIG. 9 is a diagrammatic view depicting a configuration of an inputting device according to a third embodiment of the present disclosure.

FIG. 9 is a view depicting an example of a configuration of the inputting device 1c where the bit number N is N=4. Referring to FIG. 9, the inputting device 1c in the example depicted includes four conductive members 14a to 14d, four external switches 22a to 22d, and an integrated circuit 23. The integrated circuit 23 includes four switch elements 24a to 24d, and a resistor is connected in parallel to each switch element 24, namely, to each of the switch elements 24a to 24d. Similarly as in the first embodiment, the four conductive members 14a to 14d are disposed on the touch sensor 102. Each of the conductive members 14 is connected to the integrated circuit 23 through an external switch 22. Further, each of the conductive members 14 is connected to a switch element 24 in the integrated circuit 23. Each external switch 22 is used for connection switching between the integrated circuit 23 and a corresponding conductive member 14.

When the inputting device 1c inputs information to the touch sensor 102, the four external switches 22 are switched to an on state first. Then, the switch elements 24a to 24d are switched in response to digital data to be inputted to input information to the touch sensor 102. For example, when data of 4 bits of "1101" is to be inputted, the switch elements 24a, 24b, and 24d are switched to an on state while the switch element 24c is left in an off state. Consequently, the touch sensor 102 detects presence of a material body at disposition positions of the conductive members 14a, 14b, and 14d in accordance with an operation principle similar to that in the first embodiment and so forth. Therefore, the information processing apparatus 100 can acquire the data of 4 bits of "1101" by decoding a result of the detection. By repeating such a process as described above in a predetermined cycle, the inputting device 1c can input digital data to the information processing apparatus 100 by every 4 bits at one time.

[Modifications]

The inputting device according to the embodiments of the present disclosure is not limited to those of the embodiments described above. For example, in the foregoing description, the inputting device is separate from the information processing apparatus and is an operating inputting attachment which is attached later to and used together with the information processing apparatus. However, the inputting device may otherwise be disposed in the housing of the information processing apparatus and fabricated integrally with the information processing apparatus. Also in this case, a pushbutton can be disposed at a position spaced from the touch sensor such that the substance of an operation input to the pushbutton is inputted to the touch sensor. It is to be noted that, in this instance, at least the region of the detection face of the touch sensor in which the conductive member is disposed may not be exposed to the surface of the housing of the information processing apparatus.

Further, while, in the first and second embodiments, the substance of an operation input of a pushbutton by a user is inputted to a touch sensor, the input to the touch sensor is not limited to this. In particular, the inputting device according to the embodiments of the present disclosure may input the substance of an operation of various operation members by a user to the touch sensor. Also in this instance, the inputting device has a built-in switch which is interlocked with the operation member such that, when the operation member is operated, the switch is switched between on and off in an interlocking relationship with the operation member. Consequently, the inputting device according to the embodiments of the present disclosure is not limited to pushbutton and can input it to the touch sensor that an operation is performed for the various operation members. Further, the operation member may be of a type which allows a rotational operation or a tilting operation thereof. In this instance, by configuring the inputting device such that the resistance value of a variable resistor varies in response to an operation amount of an operation for rotating or tilting the operation member, the information processing apparatus can detect the amount of the operation performed for the operation member by the user.

Here, an example of a technique for inputting the substance of a tilting operation for a tiltable operation member to a touch sensor is described. The inputting device in this case includes a tiltable operation member 200. FIGS. 10A and 10B are views depicting a shape of the tiltable operation member 200, and particularly, FIG. 10A is a sectional view as viewed in a direction from a side and FIG. 10B is a top plan view. As depicted in FIGS. 10A and 10B, the tiltable operation member 200 includes a disk-shaped operation portion 201, a supporting portion 202, and a hinge 203. A ring-shaped conductive member 204 is fixed to a lower face of the operation portion 201 such that it is centered at the supporting portion 202. The conductive member 204 is connected to a ground terminal 206 through a resistor 205. The ground terminal 206 is connected to the ground of the touch sensor 102 similarly to the ground terminal 15a described hereinabove.

In the example depicted in FIGS. 10A and 10B, the hinge 203 is fixed on the protective film 102a of the touch sensor 102, and the supporting portion 202 is supported such that it is erected uprightly on the detection face of the touch sensor 102. The supporting portion 202 is configured for tilting movement in an arbitrary direction around the hinge 203 over a circumferential range of 360 degrees. The user would, for example, hold down an upper face of the operation portion 201 and perform an operation of tilting the supporting portion 202.

Figure 11:
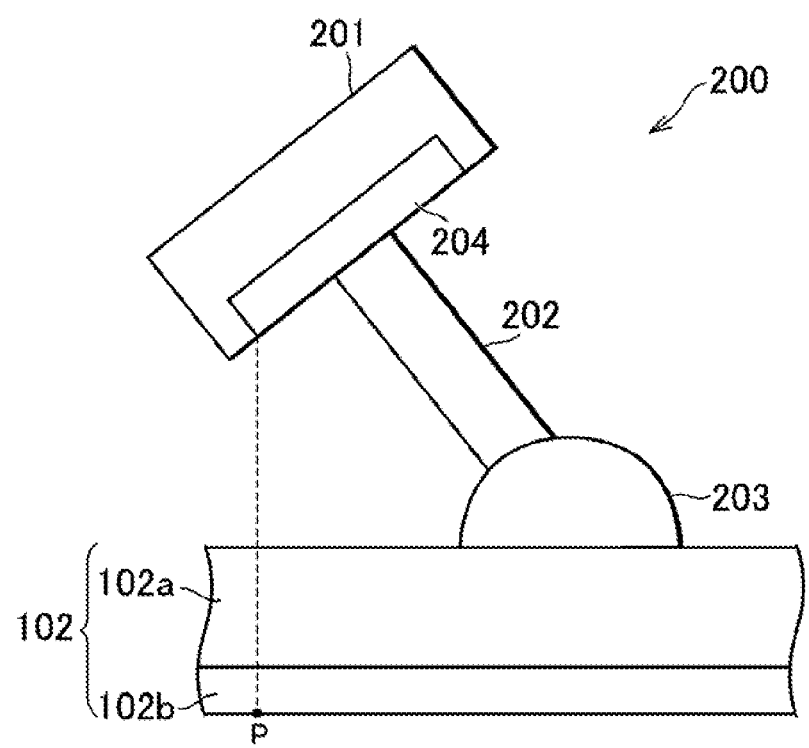
FIG. 11 is a view illustrating a manner of the tiltable operation member in a tilting operation.

The conductive member 204 cooperates with a conductive film 102b in the touch sensor 102 to form a capacitor. The distance from the conductive member 204 to the conductive film 102b varies in response to the tilting operation of the tiltable operation member 200 by the user. FIG. 11 is a view illustrating a manner of the tiltable operation member 200 during a tilting operation. As depicted in FIG. 11, if the user carries out a tilting operation toward an arbitrary direction (here, in the leftward direction in FIG. 11), then the conductive member 204 approaches the conductive film 102b in the direction in which the tilting operation is carried out. In response to the approach, the touch sensor 102 detects the presence of a material body in the proximity of a position P in FIG. 11. The information processing apparatus 100 specifies the direction of the position P with reference to a reference position (position at which the hinge 203 is disposed) to specify in which direction the tiltable operation member 200 is tilted by the user.

It is to be noted that, also in the example depicted in FIGS. 10A, 10B, and 11, since the conductive member 204 is connected to the ground of the information processing apparatus 100 through the resistor 205, it is possible to prevent the conductive member 204 from being electrically isolated from the information processing apparatus 100 and stabilize the potential of the conductive member 204 similarly as in the inputting device 1a according to the first embodiment and so forth.

The present disclosure contains subject matter related to that disclosed in Japanese Priority Patent Application JP 2014-150229 filed in the Japan Patent Office on Jul. 23, 2014, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An inputting device, comprising:
   a conductive member disposed on a capacitance type touch sensor and cooperating with the touch sensor to form a capacitor therebetween;
   a ground terminal connected to a ground of the touch sensor;
   a current path interconnecting the conductive member and the ground terminal;
   a switch disposed on the current path;
   a pushbutton configured to be operated by a user, the switch being switched by depression of the pushbutton; and
   a variable resistor connected in series with the switch and having a resistance value which varies in response to an operation amount of the pushbutton by the user,
   wherein a result of detection by the touch sensor varies in response to switching of the switch.

2. The inputting device according to claim 1, further comprising a resistor connected in parallel to the switch.

3. An inputting device, comprising:
   a frame defining a recess that is sized and shaped to receive and release a mobile computing device therein, where the mobile computing device includes a display on a front face thereof and at least one capacitance type touch sensor on a rear face thereof, opposite to the front face;
   a conductive member disposed within the recess of the frame such that the conductive member cooperates with the at least one capacitance type touch sensor on the rear face of the mobile computing device to form a capacitor therebetween when the mobile computing device is located within the recess; and
   a pushbutton disposed in the frame and configured to be operated by a user, where operation of the pushbutton causes an electrical interaction of the conductive member and the at least one capacitance type touch sensor on the rear face of the mobile computing device.

4. The inputting device of claim 3, further comprising:
   a ground terminal connected to a ground of the capacitance type touch sensor;
   a current path interconnecting the conductive member and the ground terminal; and
   a switch disposed on the current path, wherein:
   depression of the pushbutton causes the switch to be switched, resulting in the electrical interaction of the conductive member and the at least one capacitance type touch sensor.

5. The inputting device of claim 4, further comprising:
   a variable resistor connected in series with the switch and having a resistance value which varies in response to an operation amount of the pushbutton by the user,
   wherein a result of detection by the touch sensor varies in response to switching of the switch.

6. The inputting device of claim 4, further comprising a resistor connected in parallel to the switch.

7. The inputting device of claim 3, wherein:
   the frame includes at least one side surface extending transversely with respect to the at least one capacitance type touch sensor of the mobile computing device when the mobile computing device is located within the recess; and
   the pushbutton is disposed on the at least one side surface.

8. The inputting device of claim 3, further comprising an aperture through the frame that is sized and shaped to be in registration with at least a portion of the at least one capacitance type touch sensor of the mobile computing device when the mobile computing device is located within the recess, wherein the user may access the at least a portion of the at least one capacitance type touch sensor through the aperture.

* * * * *